US011322873B2

(12) United States Patent
Freitag et al.

(10) Patent No.: US 11,322,873 B2
(45) Date of Patent: May 3, 2022

(54) CONNECTING ASSEMBLY FOR ELECTRICALLY CONNECTING A RIBBON CABLE IN AN AIRCRAFT

(71) Applicant: Airbus Operations GmbH, Hamburg (DE)

(72) Inventors: Klaus-Udo Freitag, Hamburg (DE); Yener Palit, Hamburg (DE)

(73) Assignee: AIRBUS OPERATIONS GMBH, Hamburg (DE)

( * ) Notice: Subject to any disclaimer, the term of this patent is extended or adjusted under 35 U.S.C. 154(b) by 0 days.

(21) Appl. No.: 17/185,239

(22) Filed: Feb. 25, 2021

(65) Prior Publication Data

US 2021/0273360 A1 Sep. 2, 2021

(30) Foreign Application Priority Data

Feb. 29, 2020 (DE) ..................... 10 2020 105 421.1

(51) Int. Cl.
*H01R 12/79* (2011.01)
*H01R 12/70* (2011.01)
*H01R 12/67* (2011.01)

(52) U.S. Cl.
CPC ........... *H01R 12/79* (2013.01); *H01R 12/675* (2013.01); *H01R 12/7023* (2013.01); *H01R 2201/26* (2013.01)

(58) Field of Classification Search
CPC .......................... H01R 23/684; H01R 23/6833; H01R 13/641; H01R 12/79; H01R 12/7023; H01R 12/675; H01R 2201/26

(Continued)

(56) References Cited

U.S. PATENT DOCUMENTS

| 4,443,049 A | 4/1984 | De Pommery et al. |
| 4,687,464 A * | 8/1987 | Troutner ............. A61M 1/3683 604/6.08 |

(Continued)

FOREIGN PATENT DOCUMENTS

| DE | 10321184 A1 | 12/2004 |
| DE | 102015008999 A1 | 1/2017 |

(Continued)

OTHER PUBLICATIONS

German Search Report; priority document.

*Primary Examiner* — Gary F Paumen
(74) *Attorney, Agent, or Firm* — Greer, Burns & Crain, Ltd.

(57) ABSTRACT

A connecting assembly for electrically connecting a ribbon cable in an aircraft. The assembly has a housing with a slot-shaped opening through which an end section of a ribbon cable can be inserted into a housing interior into a predetermined insertion position. The assembly has a first and a second engagement section which are arranged in the interior. The first engagement section is mounted such that it can be optionally moved between a first and a second position, such that by moving the first engagement section into its second position, the end section can be clamped tight optionally between the first second engagement sections and conductor tracks of the ribbon cable are then in contact with a corresponding number of electrical contacts provided on the first engagement section. In the second position, the first engagement section is releasably secured by a latching device.

15 Claims, 3 Drawing Sheets

(58) Field of Classification Search
USPC .............................. 439/260, 267, 489, 490
See application file for complete search history.

(56) References Cited

U.S. PATENT DOCUMENTS

| | | | | |
|---|---|---|---|---|
| 5,473,505 A | * | 12/1995 | Kessoku | ............... G06K 7/0021 |
| | | | | 361/679.32 |
| 5,795,172 A | * | 8/1998 | Shahriari | ........... G01R 31/2808 |
| | | | | 439/260 |
| 6,273,747 B1 | | 8/2001 | Helfrich | |
| 7,438,578 B1 | * | 10/2008 | Nin | ........................ H01R 12/89 |
| | | | | 439/260 |
| 8,221,146 B2 | * | 7/2012 | Duesterhoeft | ....... H05K 7/1439 |
| | | | | 439/260 |
| 8,221,147 B2 | * | 7/2012 | Ozeki | .................... H01R 12/88 |
| | | | | 439/260 |
| 8,282,290 B2 | * | 10/2012 | Mulfinger | ............... H01R 12/88 |
| | | | | 385/53 |
| 8,851,913 B2 | * | 10/2014 | Chobot | .................. H01R 33/94 |
| | | | | 439/260 |
| 2007/0259551 A1 | * | 11/2007 | Rebel | ........................ E05C 3/34 |
| | | | | 439/260 |
| 2008/0207035 A1 | * | 8/2008 | Jahn | ........................ H01R 12/52 |
| | | | | 439/329 |
| 2010/0041263 A1 | * | 2/2010 | Altonen | ............... H01R 13/641 |
| | | | | 439/260 |
| 2013/0194734 A1 | | 8/2013 | Yoshikawa | |

FOREIGN PATENT DOCUMENTS

| | | |
|---|---|---|
| EP | 1081809 A1 | 3/2001 |
| GB | 2043365 A | 10/1980 |
| WO | 2017090388 A1 | 9/2018 |

\* cited by examiner

CONNECTING ASSEMBLY FOR ELECTRICALLY CONNECTING A RIBBON CABLE IN AN AIRCRAFT

CROSS-REFERENCES TO RELATED APPLICATIONS

This application claims the benefit of the German patent application No. 102020105421.1 filed on Feb. 29, 2020, the entire disclosures of which are incorporated herein by way of reference.

FIELD OF THE INVENTION

The present application relates to a connecting assembly for electrically connecting a ribbon cable in an aircraft, i.e., for electrically connecting the conductor tracks of a ribbon cable to corresponding lines in an aircraft, such as, for example, lines in a device or on a circuit board of a device, as well as a device with such a connecting assembly.

BACKGROUND OF THE INVENTION

The use of ribbon cables in aircraft can have advantages over the use of round cables because they take up less space with an identical line capacity, are lower in weight and can be laid more flexibly. In the prior art it is known to provide the ribbon cables with plugs or sockets that are adapted for ribbon cables and which are plugged into corresponding sockets or plugs of devices.

SUMMARY OF THE INVENTION

An object of the present invention is to configure a connecting assembly for electrically connecting a ribbon cable in an aircraft in such a way that the connection is possible in a particularly easy and cost-effective way and that the connecting assembly is particularly low in weight.

According to the present invention, a connecting assembly is provided for electrically connecting a ribbon cable in an aircraft, i.e., for releasably electrically connecting a ribbon cable and/or its conductor tracks to corresponding lines in an aircraft, such as, for example, lines in an electronic or electrical device or on a circuit board of the electronic or electrical device in the aircraft. As will become clear below, the connecting assembly can be, in particular, part of such an electronic or electrical device, but can also be provided separately therefrom.

The connecting assembly has a housing which defines an interior and has a slot-shaped opening. The interior is accessible from outside the housing through the opening, i.e., the slot-shaped opening connects the interior to the surroundings of the housing. The slot-shaped opening is preferably bounded by one or more sealing elements so that the ingress of moisture through the slot-shaped opening after a ribbon cable has been inserted into the slot-shaped opening in the way described below is prevented. The housing can be embodied in one piece or be composed of two halves or of a plurality of parts which are joined together, if appropriate releasably, wherein the halves or parts are then preferably connected to one another in a seal-forming fashion.

Furthermore, the connecting assembly has a first engagement section and a second engagement section which are arranged in the interior. The first engagement section is mounted in the interior in such a way that it can be moved, preferably along a predetermined path or a predetermined movement path, optionally between a first position and a second position. The second engagement section is arranged in a third position or can be moved into that position.

In addition, the connecting assembly has an activation device which can be operated from the outside and which is adapted to move the first engagement section optionally between the first position and the second position. The activation device additionally has a first operator control element, which is externally accessible, i.e., for a user without opening the housing, for a user to operate the activation device and therefore, in particular, to bring about the movement of the first engagement section between the first position and the second position by means of the activation device.

Furthermore, the connecting assembly has a latching device which is adapted to be moved by a user optionally into a latching position and into a release position. The change between the release position and the latching position can also be brought about here indirectly by the user in that, for example, in a specific position of the first engagement section or a specific position of the activation device, the latching device changes automatically from the release position into the latching position, for example using a suitable pretensioning device. The change from the latching position into the release position can also be done in this way. However, it is also possible to provide that the latching device can be moved from the latching position into the release position only by a suitable separate operator control action of a user. The latching device is, in any case, adapted in order to prevent a movement of the first engagement section out of the second position in the direction of the first position in the latching position and to permit such movement in the release position. To this end, it may be necessary for the first engagement section to be in a suitable position if the latching device changes from the release position into the latching position. This suitable position can be the second position or another position, such as, for example, a position which is still further away from the first position than the second position. The latching device can have, for example, a groove which is provided on a movable part of the activation device, such as, for example, the first operator control element, and can have a ball or a pin which bears against a surface of the movable part of the activation device and is pretensioned against this surface by a spring. The groove in this surface is arranged in such a way that the ball or the pin reaches the groove, and is pressed by the spring into the groove, precisely when the first engagement section reaches the second position. Such a latching device can be configured in such a way that the change into the release position can be carried out easily by activating the first operator control element by applying a force which overcomes the spring force which presses the ball or the pin into the groove.

In addition, the connecting assembly has a first contact assembly with a multiplicity of first electrical contacts which are provided spaced apart from one another on the first engagement section and/or the second engagement section. In other words, each of the first electrical contacts is provided on the first engagement section or on the second engagement section. In this context, all the first electrical contacts can be provided on the first engagement section, all the first electrical contacts can be provided on the second engagement section, or some of the first electrical contacts can be provided on the first engagement section and some other of the first electrical contacts can be provided on the second engagement section.

In addition, the connecting assembly has a number of first output lines which corresponds to the number of first electrical contacts, each of which output lines is electrically connected or can become connected, in particular by an arrangement of switches, to another of the first electrical contacts.

The connecting assembly also has a number of locking projections, each of which is provided on the first engagement section or the second engagement section. Such a locking projection can therefore be provided. It is preferable, however, if two or more such locking projections are provided.

The slot-shaped opening, the first engagement section, the second engagement section, the first contact assembly and the locking projections are arranged and dimensioned in such a way that after the insertion of a ribbon cable, which has a predetermined configuration, which is described below, through the slot-shaped opening, they interact with one another and with the ribbon cable in a determined fashion. The ribbon cable has in a usual fashion a ribbon-shaped, flat carrier material and a multiplicity of conductor tracks which are embedded in the carrier material in a predetermined arrangement one next to the other. In this context, conductor tracks can be arranged one next to the other in only a single plane, but also one on top of the other, for example, in two planes which are separated from one another by regions of the carrier material, wherein a plurality of the conductor tracks are arranged one next to the other in each of the two planes. The ribbon cable has, with respect to the axial direction of extent of the ribbon cable, an end section which is configured in a predetermined fashion such that it has predetermined cross-sectional dimensions and a predetermined cross-sectional shape (i.e., in the cross section with respect to the axial or longitudinal direction of extent of the ribbon cable) at each point along the axial direction of extent of the ribbon cable. The end section also has a number of through-openings which corresponds to the number of the locking projections, each of which through-openings is formed in a predetermined position, with respect to the longitudinal edges and the axial end of the end section of the ribbon cable, by the carrier material. In an axial end region of the end section the carrier material is partially removed (this comprises configurations in which the carrier material has been partially omitted from the beginning), such that in the end region the conductor tracks are exposed on one or both extended surfaces of the ribbon cable, and the carrier material is present between the conductor tracks. Since the ribbon cable in the end section has the predetermined cross-sectional dimensions and the predetermined cross-sectional shape, the end section has, both in the end region and in other regions, in each case, if appropriate, different, predetermined cross-sectional dimensions and an, if appropriate, different, predetermined cross-sectional shape.

The slot-shaped opening, the first engagement section, the second engagement section, the first contact assembly and the locking projections are then arranged and dimensioned more precisely in such a way that a ribbon cable can be inserted from this predetermined configuration from the outside through the slot-shaped opening into the interior into a predetermined insertion position and can be removed again therefrom. The predetermined insertion position is preferably defined here by a stop which can be provided, for example, on the second engagement section, on a guide for the end section or as a separate section. In addition, such a guide for guiding the end section during the insertion through the slot-shaped opening along a predetermined movement path into the predetermined insertion position can preferably be provided in the interior. This guide can be provided separately from the second engagement section or can, for example, be made available by the second engagement section. After arrangement of the end section in the predetermined insertion position and subsequent movement of the first engagement section out of the first position into the second position, while the second engagement section is in the third position or is moved into that position, the end region is clamped tight with a predetermined contact pressure between the first engagement section (in total or at least a part thereof) and the second engagement section (in total or at least a part thereof). Each of the first electrical contacts is then in electrical contact with another of the conductor tracks. In addition, each of the locking projections is in engagement with another of the through-openings in the end section in such a way that the end section is secured in the predetermined insertion position in the interior, i.e., it can, in particular, also not be pulled out of the interior.

The connecting assembly also has an indicator device which is adapted to make available one or more indications which can be detected from outside the housing, for example which can be perceived by a user or detected as such by evaluation of a detection signal, and which, in each case, indicate individually or in combination when the first engagement section is in the second position, the second engagement section is in the third position and the latching device is in the latching position. Therefore, when the end section is in the predetermined insertion position, these indications also indicate that the predetermined contact pressure is applied to the end region, the first electrical contacts are in electrical contact with the conductor tracks, and the locking projections are in engagement with the through-openings.

This configuration of the connecting assembly has the advantage that the ribbon cable does not have to be provided with a plug or a socket but rather, after the suitable exposure of the conductor tracks which is also necessary for connection to a plug or a socket, can very easily be inserted directly into the connecting assembly and securely connected to the first contacts, without the connection being able to become released. In this context, it is possible for a user to detect unambiguously, by means of the indicator device, whether the electrical connection is established and whether the ribbon cable is securely connected to the connecting assembly. By dispensing with a plug or a socket in the ribbon cable it is also possible to save weight.

In one preferred embodiment, the indications of the indicator device comprise an electrical indication signal which is output via a connector for connecting to an external monitoring device. This electrical indication signal can then be received and evaluated by the external monitoring device, in order, for example, to display on a screen whether a ribbon cable is securely connected to the connecting device. Alternatively or additionally, the electrical indication signal can be received and evaluated by an internal monitoring device and/or be used to actuate an externally visible lighting device, provided on the housing, in such a way that a predetermined lighting state of the lighting device represents one of the at least one indication. For example, the indication can comprise the fact that the first lighting device lights up or does not light up, or in a specific color in which the first lighting device lights up. The first lighting device can preferably have one or more LEDs which are mounted on the housing of the connecting assembly and can be seen by a user from the outside. In addition it is alternatively or additionally possible to convert the electrical indication signal, by means of a connecting assembly or an external device, into a wireless signal such as, for example, a WLAN or Bluetooth signal, and to irradiate the wireless signal through a suitable transmitter device which is provided in the connecting assembly or externally. It is also alternatively or additionally possible to convert the electrical indication signal, by means of a device provided in the connecting assembly or an external device, into a corresponding data signal or to transmit it via a voltage line or power line.

In this embodiment it is also preferred if the indicator device has a second contact assembly with at least one pair of second electrical contacts spaced apart from one another, and a third contact assembly with at least one third electrical contact. Each of the pairs of second electrical contacts is provided on one of the first engagement section and the second engagement section, and each of the pairs of second electrical contacts is respectively assigned one of the third electrical contacts, which is provided on the other of the first engagement section and the second engagement section and is arranged in such a way that it is in electrical contact with the pair of second electrical contacts assigned thereto, and connects the electrical contacts to one another in a conductive fashion, precisely when the first engagement section is in the second position, the second engagement section is in the third position, and the latching device is in the latching position. It is preferred here if the latching device changes from the release position into the latching position precisely when the first engagement section reaches the second position, as has already been described above. The indicator device has a detection device. This is adapted to detect whether the second electrical contacts of each of the pairs of second electrical contacts are connected to one another in a conductive fashion and to generate the electrical indication signal precisely when the detection device detects that the second electrical contacts of each of the pairs of second electrical contacts are connected to one another in a conductive fashion. It is also preferred if each of the third electrical contacts is formed by two of the locking projections. For each of the third electrical contacts, the corresponding two locking projections are provided on one of the first and second engagement section, and the assigned pair of the second electrical contacts is provided on the other of the first and second engagement section, and arranged in such a way that each of the two second electrical contacts is situated opposite another of the two locking projections. In other words, these two locking projections are connected to one another in a conductive fashion and configured in such a way that they are electrically conductive in their entirety or at least parts of them which come into electrical contact with the respective second electrical contacts after the locking projections are passed through the corresponding through-openings.

In one preferred embodiment, at least one of the indications of the indicator device consists in the fact that a mechanically movable indicator element is in a predetermined position. The mechanically movable indicator element can preferably be formed here by the first operator control element. The predetermined position of the indicator element is then a position of the first operator control element in which the first engagement section is in the second position, and the latching device is in the latching position. It is preferred here if the latching device changes from the release position into the latching position precisely when the first engagement section reaches the second position, as has already been described above.

In one preferred embodiment, the activation device has a first pretensioning device which preferably comprises one or more springs or spring elements. This first pretensioning device pretensions the first engagement section in the direction of the first position or into the first position. This configuration advantageously ensures that the activation device merely has to be configured in such a way that it actively moves the first engagement section from the first position into the second position, for example by means of an element which engages on the first engagement section and correspondingly moves it. The return movement from the second position into the first position after the movement of the latching device into the release position is, on the other hand, brought about by the pretensioning device.

In one preferred embodiment, the activation device has an element which is arranged in the interior and is mounted so as to be rotatable about a predetermined rotational axis. The element is preferably straight and rod-shaped, wherein the rotational axis then corresponds to the longitudinal axis of the rod-shaped element. The rotatably mounted element is, in any case, coupled to the first operator control element in such a way that a rotation of the first operator control element brings about a corresponding rotation of the rotatably mounted element. For this purpose, the rotatably mounted element can, for example, be rigidly connected to the first operator control element or embodied in one piece therewith or can be coupled thereto via a gear mechanism. The rotatably mounted element has a, e.g., pin-shaped, cam projection which protrudes radially with respect to the rotational axis and is configured and arranged in such a way that when the first engagement section is in the first position, the cam projection is spaced apart from the first engagement section in a first rotational position of the first operator control element. Through subsequent rotation of the first operator control element into a second rotational position, the cam projection engages on the first engagement section and moves it into the second position. In other words, the cam projection engages on the first engagement section when the first operator control element is located between the first and second rotational positions and moves the cam projection from the first position into the second position through further rotation of the first operator control element into the second rotational position. In particular, in the case of a pin-shaped configuration of the cam projection, the cam projection can, for example, engage on a curve section of the first engagement section.

In one preferred embodiment, the latching device has a second pretensioning device which pretensions the latching device into the latching position and which, similarly to the first pretensioning device already described, preferably comprises one or more springs or spring elements.

In one preferred embodiment, the latching device has a latching element or a latching cutout which is provided on the first engagement section or a section of the activation device, and a complementary latching cutout or a complementary latching element which is provided, for example, on the housing or an element which is rigidly connected thereto. The latching element and the associated latching cutout are arranged in such a way that in the latching position the latching element is in engagement with the latching cutout in such a way that the first engagement section, which is in the second position, is secured in that position and is out of engagement with the latching cutout in the release position. The latching element can be a latching projection which is, for example, rigidly connected to the first engagement section or the abovementioned section of the activation device or is embodied in one piece therewith. Alternatively, the latching element can be a separate element which is preferably mounted in such a way that it can be moved between two positions (for example in the first engagement section or the abovementioned section of the activation device or else on the housing or an element which is rigidly connected thereto) which make available the latching position and the release position. It is preferred if the latching element is pretensioned by the abovementioned second pretensioning device into the position which represents the latching position. In the above embodiment in which the activation device has an element which is arranged in the interior and which is mounted so as to be rotatable about a predetermined rotational axis, the latching projection can be formed, for example, by the cam projection or by a separate projection which is provided on the rotatably mounted element. The latching projection and the latching cutout can preferably be part of a bayonet arrangement which is made available by the latching device. Alternatively, the latching projection and the latching cutout can, as mentioned above, be a pin or a ball or a depression or groove.

In one preferred embodiment, the latching device has a separate second operator control element which is adapted to move the latching device optionally out of the latching position into the release position. Alternatively, the first operator control element and the activation device are adapted to move the latching device optionally out of the latching position into the release position. In order to bring about the latter, it is possible to provide, for example, that a force which is increased in comparison with the normal movement of the operator control element has to be applied to the first operator control element in order to move the latching device out of the latching position into the release position and therefore move the first engagement section out of the second position.

In one preferred embodiment, the latching device has the abovementioned second operator control element, and the second operator control element is also adapted to move the latching device optionally out of the release position into the latching position. Alternatively, the first operator control element and the activation device are adapted to move the latching device optionally out of the release position into the latching position, for example by configuring the latching device, as already mentioned above, in such a way that it changes out of the release position into the latching position when the first engagement section reaches the second position when the activation device is activated using the first operator control element.

In one preferred embodiment, the connecting assembly has a switch assembly which can be switched by a user between a first and a second switch position. In this context, a further lighting device can preferably be provided on the housing, the lighting device being, for example, a further LED which indicates, by means of its lighting state or its color, whether the switch assembly is in the first switch position or in the second switch position. In any case, the switch assembly is configured in such a way that in the first switch position, each of the first electrical contacts is electrically connected to another first assigned output line of the first output lines. In addition, the switch assembly is configured in a first variant of this embodiment in such a way that in the second switch position, each of the first electrical contacts is electrically connected to another second assigned output line of the first output lines, which second assigned output line is different from the first assigned output line. The first and second assigned output lines are selected such that by changing between the first and second switch positions, swapping of the polarity of a ribbon cable whose end section is in the predetermined insertion position is compensated for, i.e., swapping of the signals on the conductor tracks, which consists of the fact that the signals are not fed onto the conductor tracks in a specific sequence starting from the left-hand edge of the ribbon cable but rather from the right-hand edge. In addition, in the case of a ribbon cable of symmetrical design, a change between the two possible orientations of the end section when insertion occurs into the interior can be compensated for. In an alternative variant, the connecting assembly has a number of second output lines which corresponds to the number of first electrical contacts, which second output lines are different from the first output lines. In the second switch position each of the first electrical contacts is electrically connected to another of the second output lines, which is different from the first assigned output line. The first and second output lines can then be connected to corresponding lines of a device in such a way that the compensation described above is brought about again.

In this embodiment, it is also preferred if the activation device is adapted in such a way that by using the first operator control element the switch assembly can be switched by a user between the first and second switch positions. For example, in the embodiment described above, in which a rotation of the first operator control element brings about a movement of the first engagement section, there can be provision that the switching is carried out by moving the first operator control element in the direction of the rotational axis. The first operator control element can then be rotated as well as pushed and/or pulled in an axial direction.

In a further preferred embodiment, the connecting assembly has the above-described elements and components of the various embodiments in duplicate, with the exception of the housing. In the housing, two slot-shaped openings are correspondingly provided, and an end section of a ribbon cable can be inserted through each of these two slot-shaped openings in the described way into the respective insertion position of the cable, and its conductor tracks can be brought into contact with the first electrical contacts, assigned to the respective slot-shaped opening, of the respective first contact assembly. The first output lines assigned to the one slot-shaped opening are each connected to the first output lines assigned to the other slot-shaped opening, so that the conductor tracks of the two ribbon cables and therefore the ribbon cables are electrically connected to one another when their end sections are in the insertion position, and the first engagement sections are in their second position in a latched fashion.

The connecting assembly according to one of the embodiments described above is preferably part of a device in an aircraft. According to the present invention, a device in an aircraft or for an aircraft is therefore also provided with a connecting assembly according to one of the configurations described herein. The device has a device housing in which the connecting assembly is accommodated, or a section of which forms the housing of the connecting assembly. The first output lines are connected to lines of the device. Of course, the device can also have a plurality of the connecting assemblies for connecting a plurality of ribbon cables to the device.

BRIEF DESCRIPTION OF THE DRAWINGS

The invention will be explained in more detail below with reference to the figures in which two exemplary embodiments are illustrated.

DETAILED DESCRIPTION OF THE PREFERRED EMBODIMENTS

Figure 1:
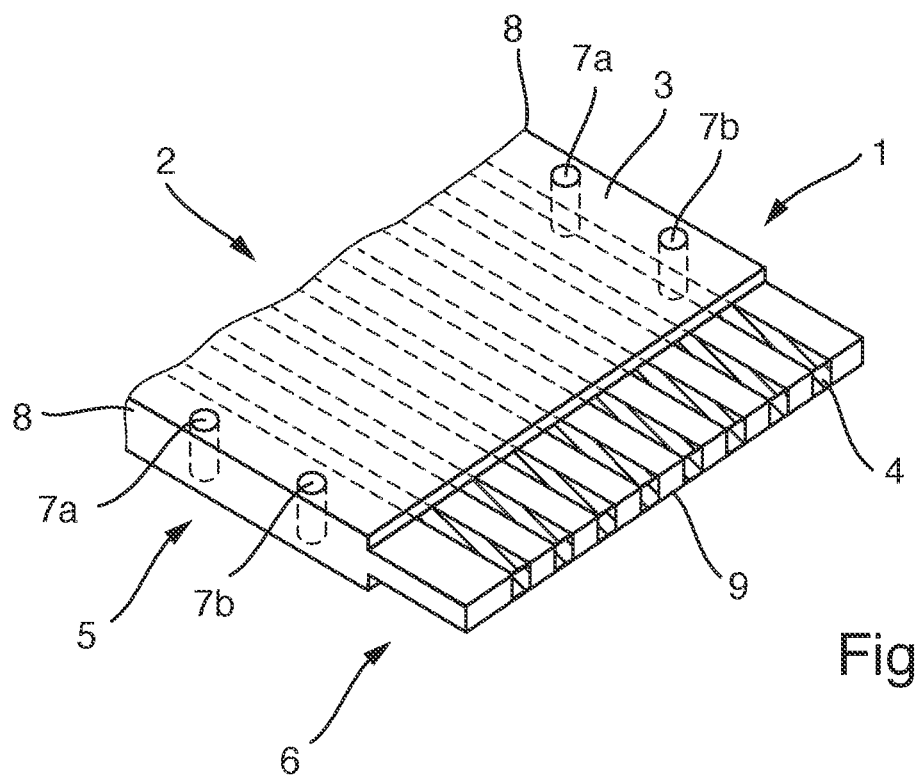
FIG. 1 shows a schematic perspective view of an end section of a ribbon cable in which all the conductor tracks are arranged in a single plane.

FIG. 1 shows a schematic perspective view of an end section 1 of a ribbon cable 2 which is configured for use with a connecting assembly according to the invention. The end section 1 is located at an axial end of the ribbon cable 2, of which only the end section 1 is illustrated in FIG. 1. The ribbon cable 2 has a flat, electrically nonconductive, flexible carrier material 3 and a multiplicity of conductor tracks 4 which are embedded in the carrier material 3 in such a way that they are electrically insulated from one another and run parallel to the longitudinal direction of extent of the ribbon cable 2. In the exemplary embodiment shown in FIG. 1, all the conductor tracks 4 are arranged in a single plane which runs parallel to the two extended surfaces of the carrier material 3. As can be seen in the cross-sectional view of part of an end section 1 of another exemplary embodiment of a ribbon cable shown in FIG. 2, which is adapted for use with a connecting assembly according to the invention, it is, however, also possible for the conductor tracks 4 to extend in two planes which are parallel to one another and to the two extended surfaces of the carrier material 3.

The end section 1 has, in each case, a main area 5 (shown only partially in FIG. 2) and an end area 6 at the exterior axial end of the end section 1 or ribbon cable 2. In the end area 6, the part of the carrier material 3 which is located above and below the plane of the conductor tracks 4 (in the case of FIG. 1) or above the upper plane of the conductor tracks 4 and below the lower plane of the conductor tracks 4 (in the case of FIG. 2) has been removed. In contrast, the carrier material 3 between the conductor tracks 4 is present, and in the case of FIG. 2, the carrier material 3 between the two planes of the conductor tracks 4 is still present. Therefore, the end area 6 corresponds, in other words, to a section of the end section 1 from which the insulation has been removed, since the conductor tracks 4 are exposed on the upper side and the underside of the end section 1 and electrical contact is able to be made with them by means of corresponding contacts.

Figure 2:
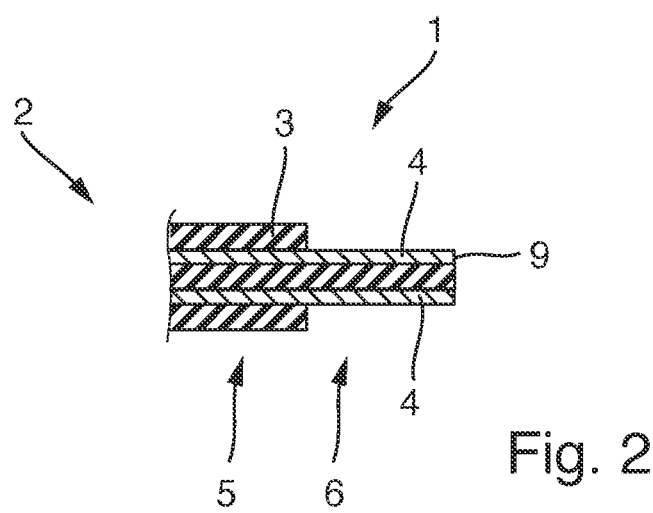
FIG. 2 shows a schematic cross-sectional view of an end section of a ribbon cable in which the conductor tracks are arranged in two planes.

In the main area 5, two through-openings 7a, 7b, each of which connects the upper side and the underside of the carrier material 3 to one another, are respectively formed by the carrier material 3 in the vicinity of the two longitudinal edges and spaced apart from the conductor tracks 4. In FIG. 2, the through-openings 7a, 7b are not illustrated. The through-openings 7a, 7b are arranged at predetermined positions with respect to the longitudinal edges 8 and the axial end 9 of the end section 1 and of the ribbon cable 2.

Figure 3:
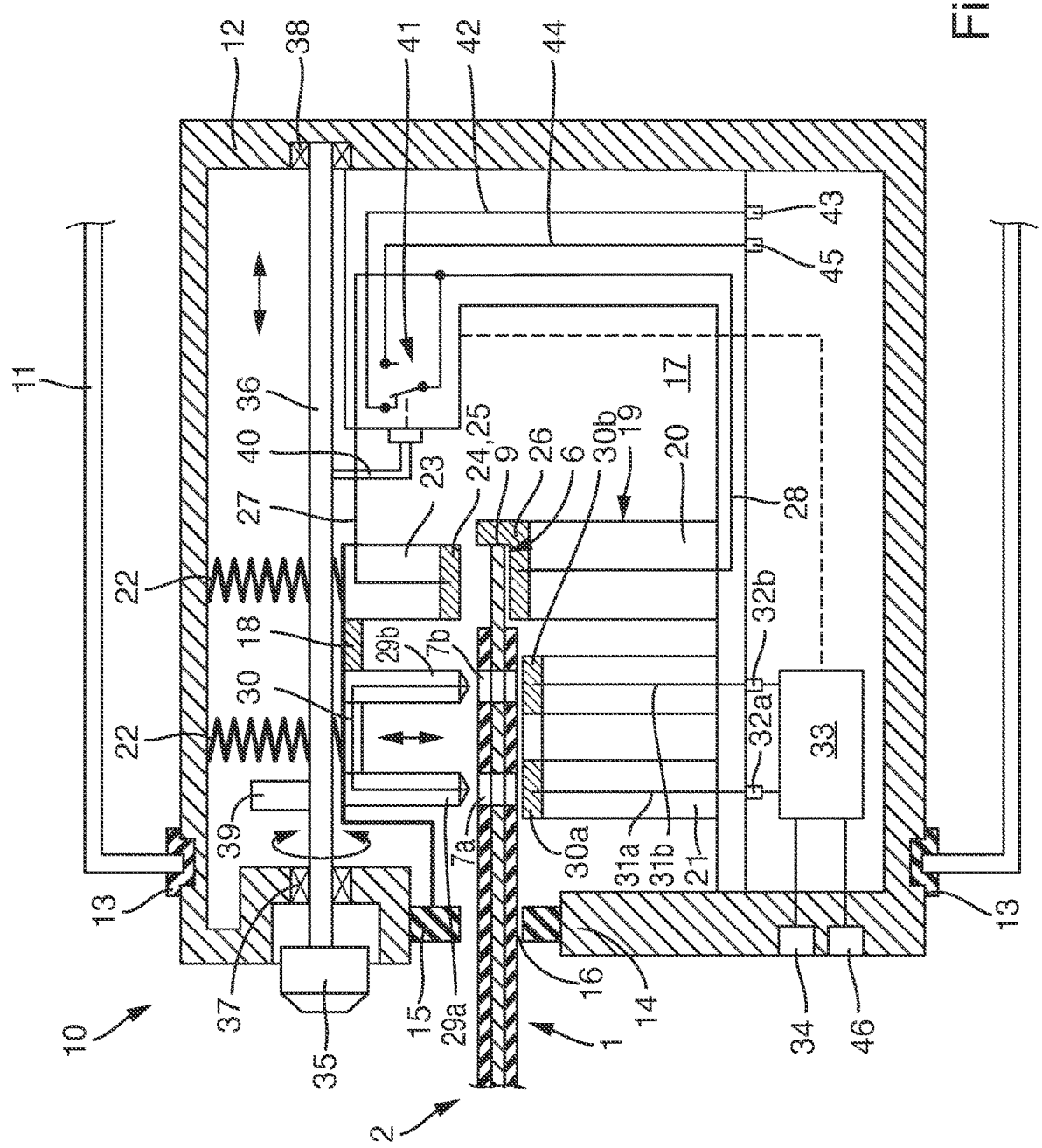
FIG. 3 shows a schematic cross-sectional view of a first exemplary embodiment of a connecting assembly which is configured for use with a ribbon cable whose end section is shown in FIG. 1.

FIG. 3 shows a first exemplary embodiment of a connecting assembly 10 which is adapted to connect a ribbon cable 2 of the configuration which is shown in FIG. 1 and in which all the conductor tracks 4 run in the same plane, to a device which is located in an aircraft, only a device housing 11 of which is shown in FIG. 3. The connecting assembly 10 has itself a housing 12 which is arranged in an opening in the device housing 11 and is connected thereto in a seal-forming fashion via sealing elements 13. The housing 12 encloses or defines an interior 17 and has an opening 14 in which sealing lips 15 define a slot-shaped opening 16 which is dimensioned and shaped in such a way that the end section 1 of the ribbon cable 2 can be inserted into the interior 17 through the opening 16. The sealing lips 15 can be fixedly arranged here in such a way that they bear against the ribbon cable 2, while it is inserted into the interior 17. However, FIG. 3 shows a configuration in which the upper sealing lip 15 is connected to the first engagement section 18, which is described below and can be moved between an upper and a lower position, such that the upper sealing lip 15 moves up and down with the first engagement section 18. The upper sealing lip 15 is then only brought into abutment with the already inserted ribbon cable 2 by movement of the first engagement section 18 into its lower position. In any case, when the ribbon cable 2 is inserted the sealing lips 15 thus prevent the ingress of moisture into the interior 17. In FIG. 3, the end section 1 is in a predetermined insertion position which is defined by a guide (not illustrated in FIG. 3) and a stop (likewise not illustrated in FIG. 3).

A first engagement section 18 and a second engagement section 19 are arranged in the interior 17. The second engagement section 19 has two separate partial sections 20 and 21 which are each fixedly mounted on the lower wall of the housing 12 and extend away from it perpendicularly upward into a fixed position into the interior 17. In contrast with the latter, the first engagement section 18 is movably mounted in the interior 17 in such a way that it can be optionally moved as a unit out of the upper position shown in FIG. 3 perpendicularly downward into a lower position and back again. The first engagement section 18 is pretensioned into the upper position by means of two springs 22 which are attached at one end to the first engagement section 18 and at the other end to the housing 12. As already mentioned above, configurations are, however, also possible in which the second engagement section 19 or at least its partial section 20 is also movably mounted in the interior 17 in such a way that it can be optionally moved as a unit out of the upper position shown in FIG. 3 perpendicularly downward into a lower position and back again. It is preferred if the movement of the second engagement section 19 or of its partial section 20 is coupled to the movement of the first engagement section 18 in such a way that a movement of the first engagement section 18 in a downward direction brings about a movement of the second engagement section 19 or of its partial section 20 in an upward direction, and vice versa.

The first engagement section 18 has a contact projection 23 which is arranged opposite the partial section 20 of the second engagement section 19 and extends perpendicularly downward and which has at its end a first contact assembly 24 with a multiplicity of first contacts 25. The number of the first contacts 25 corresponds to the number of the conductor tracks 4 of the ribbon cable 2, and the first contacts 25 are arranged spaced apart from one another along a line which runs perpendicularly with respect to the plane of the drawing in FIG. 3. The first contacts 25 are arranged in such a way that when the end area 6 of the end section 1 of the ribbon cable 2 is clamped tight after the movement of the first engagement section 18 out of the upper position into the lower position between the partial section 20 and the contact projection 23, each of the first contacts 25 is in electrical contact with another of the conductor tracks 4. In the abovementioned alternative configurations in which the second engagement section 19 or at least its partial section 20 is also movably mounted in the interior 17, the second engagement section 19 or its partial section 20 must also be moved into the corresponding position shown in FIG. 3, preferably by the described coupling of the movement to that of the first engagement section 18 or else by a separate device.

Further electrical contacts 26, which correspond in number and arrangement to the first contacts 25 are provided at the upper end of the partial section 20 of the second engagement section 19, so that each of the further contacts 26 is situated opposite another of the first contacts 25 and forms a pair therewith. The corresponding contacts 25, 26 are electrically conductively connected to one another for each pair via a corresponding pair of lines 27, 28. If the end section 1 is clamped tight between the partial section 20 and the contact projection 23, each of the further contacts 26 is therefore also in electrical contact with another of the conductor tracks 4, and the two contacts 25, 26 of each pair are in contact with the same conductor track 4.

The first engagement section 18 also has two pairs of locking projections 29a, 29b (just one pair can be seen in FIG. 3) which extend perpendicularly downward and are arranged in such a way that their position in the predetermined insertion position corresponds to the two pairs of through-openings 7a, 7b in the end section 1. Therefore, if the first engagement section 18 is moved out of the upper position into the lower position, the locking projections 29a, 29b engage through the through-openings 7a, 7b and therefore prevent a movement of the ribbon cable 2. At the upper end of the partial section 21 of the second engagement section 19, two pairs of electrical contacts 30a, 30b are provided, one for each of the locking projections 29a, 29b, respectively. They are arranged in such a way that in the lower position of the first engagement section 18 the locking projections 29a, 29b are in contact with the electrical contact 30a, 30b which is respectively assigned to them, specifically with the two ends of an electrically conductive element 30 which is respectively provided for each pair of locking projections 29a, 29b and extends through them and through an area of the first engagement section 18 which connects them. This arrangement ensures that the two contacts 30a, 30b of each corresponding contact pair are electrically disconnected from one another in the upper position of the first engagement section 18, while in the lower position of the first engagement section 18 they are electrically connected to one another by the element 30. Each pair of contacts 30a, 30b is respectively connected via connectors 32a, 32b to an evaluation unit 33 which is adapted to detect whether the contacts 30a, 30b are connected to one another or not, i.e., whether the first engagement section 18 is located in the upper or the lower position. Depending thereon, the evaluation unit 33 actuates an LED 34 which is provided on the housing 12 and which lights up in a different color depending on whether the first engagement section 18 is in the upper or the lower position. In this way, a user can easily detect whether the ribbon cable 2 is securely locked in the connecting assembly 10. However, it is also alternatively or additionally possible to provide the (or other) connectors 32a, 32b on the housing 12 in such a way that they can be connected to an evaluation unit or a processor of the device 11. This evaluation unit or the processor can then perform the actuation of the LED 34, which can then be also provided on the device 11.

In order to bring about the movement of the first engagement section 18 between the upper and the lower position, an operator control element 35 is provided which is rotatably mounted on the outside of the housing 12. The operator control element 35 is of asymmetrical design so that its rotational position can be easily seen. A rod 36, which is rotatably mounted on two bearings 37 and 38 on the housing 12 and which extends through the interior 19 extends in one piece from the operator control element 35. The rod 36 can therefore be rotated by rotating the operator control element 35. A radial projection 39, which points upward in the position of the operator control element 35 illustrated in FIG. 3, is formed on the rod 36. When the operator control element 35 is rotated through 180°, the projection 39 is rotated downward so that it initially comes into abutment with the first engagement section 18 and subsequently moves the latter, in the further course of the rotation, downward into the lower position counter to the pretensioning of the springs 22. As soon as the rod 36 reaches the 180° position with respect to the position shown in FIG. 3, it is secured in this position by a latching device. For example, the latching device can have a groove formed in the rod 36 and a ball which is arranged in a guide which is rigidly connected to the housing 12, for example in the vicinity of the bearing 38, in such a way that it is supported on the surface of the rod 36 and is pretensioned in the direction of the surface of the rod 36 by a spring. The groove is arranged in such a way that the ball is located in a region of the surface outside the groove when the first engagement section 18 is not in its lower position and reaches the groove and is pressed into it by the spring when the first engagement section reaches the lower position. After the latching device is released, the operator control element 35 can be rotated again in order to reach the position in FIG. 3, wherein the first engagement section 18 is moved into its upper position by the springs 22. In the case of the described configuration of the latching device with a groove and a ball, the latching device is released with increased application of force by rotating the operator control element 35.

The operator control element 35 and the rod 36 are also mounted in such a way that they can be pushed in the axial direction of the rod 36 and as a result an arrangement of switches 41 can be switched between two switch positions by means of activation elements 40 provided on the rod 36. In this context, a switch 41 is provided for each of the pairs of contacts 25, 26, which switch 41 connects them optionally to a connector 43 via a line 42 or to a connector 45 via a line 44. The switch position is also evaluated by the evaluation unit 33—or as in the case of the LED 34 alternatively or additionally by an evaluation unit or a processor of the device 11—and the evaluation unit—or processor—actuates, as a function of the switch position, a further LED 46 which is provided on the housing 12—or the housing 11—and which indicates the switch position by means of its color. Through the optional connection to either the connector 43 or the connector 45, which are each suitably connected to electrical lines of the device 11, it is possible to ensure that the ribbon cable 2 can be inserted in both possible orientations through the opening 16 and that polarity reversal is avoided by changing the switch position.

Figure 4:
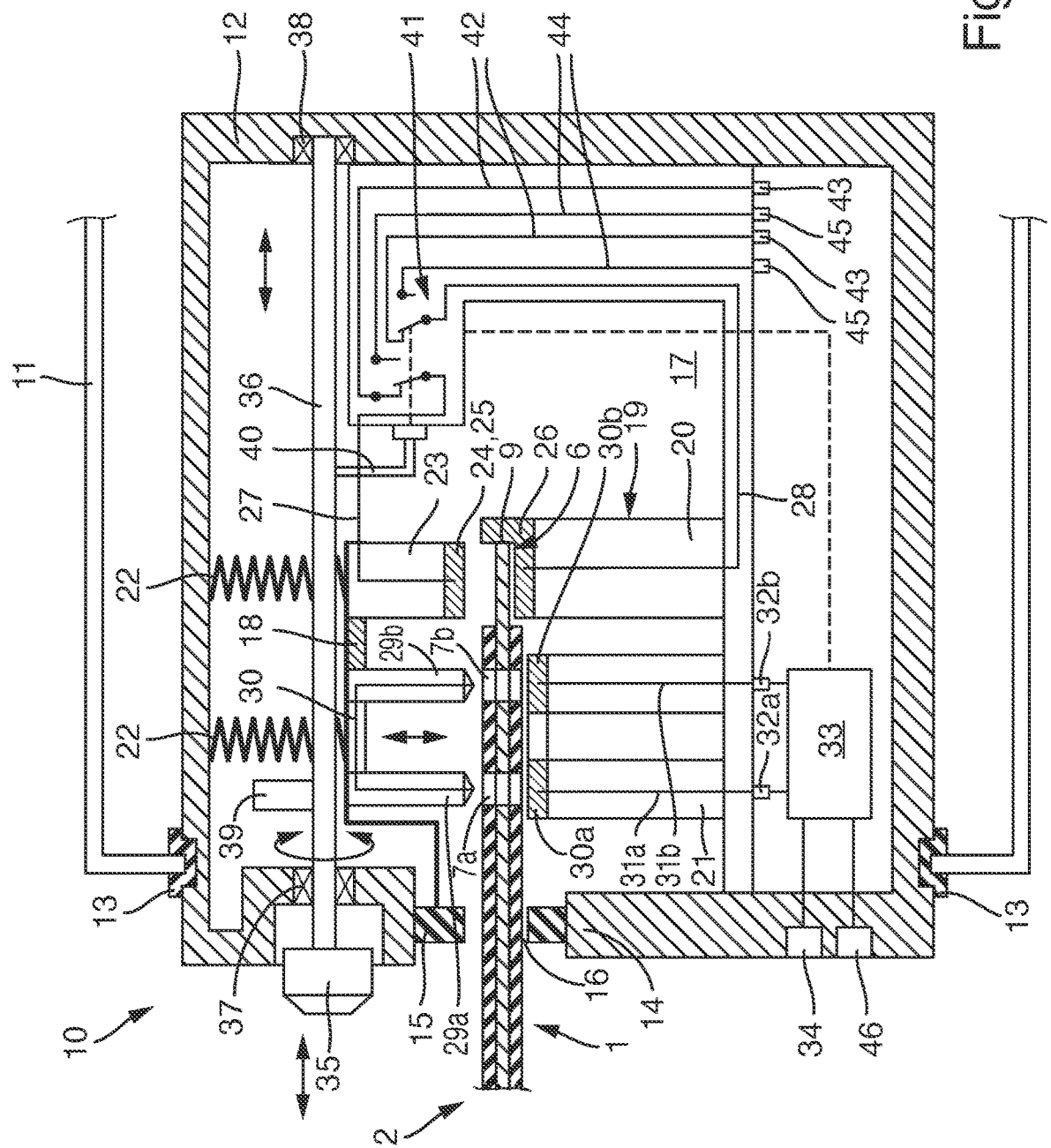
FIG. 4 shows a schematic cross-sectional view of a second exemplary embodiment of a connecting assembly which is configured for use with a ribbon cable whose end section is shown in FIG. 2.

FIG. 4 shows a second exemplary embodiment of the connecting assembly 10. It differs from the exemplary embodiment in FIG. 3 only in that it is configured for use with a ribbon cable 2 according to FIG. 2, i.e., a ribbon cable 2 in which the conductor tracks 4 are arranged in two planes. The connecting assembly 10 in FIG. 4 differs structurally from that in FIG. 3 only in that two contacts 25, 26 are not connected to one another in each case, and that the number of the switches 41 and of the connectors 43, 45 is doubled. The contacts 25, 26 are instead part of the same contact assembly, wherein the contacts 25 for making contact with the conductor tracks 4 are arranged in the upper plane, and the contacts 26 for making contact with the conductor tracks 4 are arranged in the lower plane. Each of the contacts 25, 26 is assigned one of the switches 41 and a connector pair 43, 45.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A connecting assembly for electrically connecting a ribbon cable in an aircraft, which assembly comprises
    a housing which defines an interior and has a slot-shaped opening,
    a first engagement section and a second engagement section which are arranged in the interior, wherein the first engagement section is mounted in the interior such that the first engagement section can be moved optionally between a first position and a second position, and the second engagement section is arranged in a third position or can be moved into said position,
    an activation device which is configured to move the first engagement section optionally between the first position and the second position and has a first operator control element, which is externally accessible, for a user to operate the activation device,
    a latching device which is configured to be moved by a user optionally into a latching position and into a release position, and which prevents a movement of the first engagement section out of the second position and which prevents a movement of the first engagement section out of the second position in a direction of the first position in the latching position and permits said movement in the release position,
    a first contact assembly with a multiplicity of first electrical contacts which are provided spaced apart from one another on at least one of the first engagement section or the second engagement section,
    a number of first output lines which corresponds to a number of first electrical contacts, each of which output lines is connected or can become connected to another of the first electrical contacts, and
    a number of locking projections, each of which is provided on the first engagement section or the second engagement section,
    wherein the slot-shaped opening, the first engagement section, the second engagement section, the first contact assembly and the locking projections are arranged and dimensioned in such a way that a ribbon cable which has a ribbon-shaped, flat carrier material and a multiplicity of conductor tracks which are embedded in the carrier material in a predetermined arrangement one next to the other, and with an end section which is configured in a predetermined fashion such that the end section
    has predetermined cross-sectional dimensions and a predetermined cross-sectional shape at each point along an axial direction of extent of the ribbon cable, and
    has a number of through-openings which corresponds to the number of the locking projections and is formed in a predetermined position by the carrier material,
    wherein in an axial end region of the end section the carrier material is partially removed, such that in the end region the conductor tracks are exposed on one or both extended surfaces of the ribbon cable, and the carrier material is present between the conductor tracks,
    is insertable from the outside through the slot-shaped opening into the interior into a predetermined insertion position and can be removed again therefrom, and that after arrangement of the end section in the predetermined insertion position and subsequent movement of the first engagement section out of the first position into the second position, while the second engagement section is in the third position or is moved into said position, the end region is clamped tight with a predetermined contact pressure between the first engagement section and the second engagement section, each of the first electrical contacts is in electrical contact with another of the conductor tracks, and each of the locking projections is in engagement with another of the through-openings in the end section in such a way that the end section is secured in the predetermined insertion position in the interior,
    wherein the connecting assembly also has an indicator device which is configured to make available at least one indication which can be detected from outside the housing and which indicates when the first engagement section is in the second position, the second engagement section is in the third position and the latching device is in the latching position.

2. The connecting assembly according to claim 1, in which the at least one indication comprises an electrical indication signal which is at least one of output via a connector to connect to an external monitoring device, or is used to actuate an externally visible lighting device, provided on the housing, such that a predetermined lighting state of the lighting device represents one of the at least one indication.

3. The connecting assembly according to claim 2, in which the indicator device has a second contact assembly with at least one pair of second electrical contacts spaced apart from one another, and a third contact assembly with at least one third electrical contact,
    wherein each of the pairs of second electrical contacts is provided on one of the first engagement section and the second engagement section, and each of the pairs of second electrical contacts is respectively assigned one of the third electrical contacts, which is provided on the other of the first engagement section and the second engagement section and is arranged such that the third electrical contact is in electrical contact with the pair of second electrical contacts assigned thereto, and connects said second and third electrical contacts to one another in a conductive fashion, precisely when the first engagement section is in the second position, the second engagement section is in the third position, and the latching device is in the latching position, wherein the indicator device has a detection device which is configured to detect whether the second electrical contacts of each of the pairs of second electrical contacts are connected to one another in a conductive fashion and to generate the electrical indication signal precisely when the detection device detects that the second electrical contacts of each of the pairs of second electrical contacts are connected to one another in a conductive fashion.

4. The connecting assembly according to claim 3, in which each of the third electrical contacts is formed by two of the locking projections, wherein for each of the third electrical contacts the corresponding two locking projections are provided on one of the first and second engagement section, and an assigned pair of the second electrical contacts is provided on an other of the first and second engagement section, and arranged in such a way that each of the two second electrical contacts is situated opposite the two corresponding locking projections.

5. The connecting assembly according to claim 1, in which the at least one indication comprises an indication that a mechanically movable indicator element is in the predetermined position.

6. The connecting assembly according to claim 5, in which the mechanically movable indicator element is formed by the first operator control element, wherein the predetermined position of the indicator element is a position of the first operator control element in which the first engagement section is in the second position, and the latching device is in the latching position.

7. The connecting assembly according to claim 1, in which the activation device has a first pretensioning device which pretensions the first engagement section in a direction of the first position.

8. The connecting assembly according to claim 1, in which the activation device has an element which is arranged in the interior, is mounted so as to be rotatable about a predetermined rotational axis and is coupled to the first operator control element such that a rotation of the first operator control element brings about a corresponding rotation of the rotatably mounted element, wherein the rotatably mounted element has a cam projection which protrudes radially with respect to the rotational axis and is configured and arranged such that when the first engagement section is in the first position said cam projection is spaced apart from the first engagement section in a first rotational position of the first operator control element, and through subsequent rotation of the first operator control element into a second rotational position engages on the first engagement section and moves the first engagement section into the second position.

9. The connecting assembly according to claim 1, in which the latching device has a second pretensioning device which pretensions the latching device into the latching position.

10. The connecting assembly according to claim 1, in which the latching device has a latching element or a latching cutout which is provided on the first engagement section or a section of the activation device, and a complementary latching cutout or a complementary latching element, wherein the latching element and the latching cutout are arranged such that in the latching position the latching element is in engagement with the latching cutout such that the first engagement section which is in the second position is secured in said second position and is out of engagement with the latching cutout in the release position.

11. The connecting assembly according to claim 1, in which the latching device has a separate second operator control element which is configured to move the latching device optionally out of the latching position into the release position, or the first operator control element and the activation device are configured to move the latching device optionally out of the latching position into the release position.

12. The connecting assembly according to claim 11, in which the latching device has the second operator control element, which is also configured to move the latching device optionally out of the release position into the latching position, or the first operator control element and the activation device are configured to move the latching device optionally out of the release position into the latching position.

13. The connecting assembly according to claim 1, in which the connecting assembly has a switch assembly which can be switched by a user between a first and a second switch position, and which switch assembly is configured such that
in the first switch position, each of the first electrical contacts is electrically connected to a different first assigned output line of the first output lines, and
in the second switch position, each of the first electrical contacts is electrically connected to another second assigned output line of the first output lines, which second assigned output line is different from the first assigned output line,
wherein the first and second assigned output lines are selected such that by changing between the first and second switch positions swapping of a polarity of a ribbon cable whose end section is in the predetermined insertion position is compensated for, or
the connecting assembly has a number of second output lines which corresponds to a number of first electrical contacts, and in the second switch position each of the first electrical contacts is electrically connected to another of the second output lines, which is different from the first assigned output line.

14. The connecting assembly according to claim 13, in which the activation device is configured such that by using the first operator control element, the switch assembly is switchable by a user between the first and second switch positions.

15. A device in an aircraft having a device housing in which the connecting assembly of claim 1 is accommodated, or a section of which forms the housing of the connecting assembly, wherein the first output lines are connected to lines of the device.

* * * * *